United States Patent
Nagl et al.

(10) Patent No.: US 10,965,281 B2
(45) Date of Patent: Mar. 30, 2021

(54) CIRCUIT BASED ON A III/V SEMICONDUCTOR AND A METHOD OF OPERATING THE SAME

(71) Applicant: Dialog Semiconductor (UK) Limited, London (GB)

(72) Inventors: Christoph Nagl, Graz (AT); Nebojsa Jelaca, Graz (AT); Horst Knoedgen, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/714,251

(22) Filed: Sep. 25, 2017

(65) Prior Publication Data

US 2019/0097624 A1   Mar. 28, 2019

(51) Int. Cl.

| | |
|---|---|
| H03B 1/00 | (2006.01) |
| H03K 3/00 | (2006.01) |
| H03K 17/30 | (2006.01) |
| H01L 27/06 | (2006.01) |
| H01L 29/20 | (2006.01) |
| H01L 29/778 | (2006.01) |
| H03K 17/0814 | (2006.01) |
| H01L 29/872 | (2006.01) |
| H03K 17/0812 | (2006.01) |
| H03K 17/14 | (2006.01) |
| G11C 27/02 | (2006.01) |

(52) U.S. Cl.
CPC ....... *H03K 17/302* (2013.01); *H01L 27/0605* (2013.01); *H01L 29/2003* (2013.01); *H01L 29/7787* (2013.01); *H01L 29/872* (2013.01); *H03K 17/08122* (2013.01); *H03K 17/08142* (2013.01); *H03K 17/145* (2013.01); *G11C 27/024* (2013.01)

(58) Field of Classification Search
CPC .................................................... H03K 17/302
USPC ........................................................ 327/109
See application file for complete search history.

(56) References Cited

U.S. PATENT DOCUMENTS

| | | |
|---|---|---|
| 5,764,541 A | 6/1998 | Hermann et al. |
| 7,508,267 B1 | 3/2009 | Yu et al. |
| 7,903,016 B1 | 3/2011 | Wyatt |
| 7,943,994 B2 * | 5/2011 | Huang ................ H01L 27/0727 257/341 |

(Continued)

*Primary Examiner* — Metasebia T Retebo
(74) *Attorney, Agent, or Firm* — Saile Ackerman LLC; Stephen B. Ackerman

(57) ABSTRACT

An electronic circuit provided with a III/V semiconductor domain, and a method of operating such a circuit is presented. In particular, the present application relates to electronic circuit based on a Gallium Nitride (GaN) semiconductor. GaN components must be controlled in a way that ensures proper operation over a wide variation of GaN parameters. There is a circuit comprising a first domain coupled to a second domain, the first domain being based on a III/V semiconductor; wherein the first domain comprises a first component and a second component. The second component being representative of an electrical characteristic of the first component. The second domain contains a sensor adapted to sense an electrical quantity of the second component and an input generator coupled to the sensor. The input generator is adapted to provide at least one input, based on the electrical quantity, to the first domain.

12 Claims, 6 Drawing Sheets

(56) References Cited

U.S. PATENT DOCUMENTS

| | | | |
|---|---|---|---|
| 9,425,784 B2* | 8/2016 | von Borcke | H03K 17/162 |
| 2004/0104740 A1 | 6/2004 | Burns et al. | |
| 2008/0225061 A1* | 9/2008 | Kimura | G09G 3/3233 |
| | | | 345/690 |
| 2012/0126791 A1* | 5/2012 | Nakatake | H02H 3/08 |
| | | | 324/123 R |
| 2012/0200339 A1 | 8/2012 | Ikeda | |
| 2013/0110276 A1* | 5/2013 | Cheng | G06F 30/36 |
| | | | 700/121 |
| 2013/0155741 A1 | 6/2013 | Takano | |
| 2013/0193574 A1* | 8/2013 | Farooq | H01L 25/50 |
| | | | 257/741 |
| 2013/0285146 A1* | 10/2013 | Tung | H01L 21/823807 |
| | | | 257/368 |
| 2017/0060152 A1* | 3/2017 | Martini | G05F 1/46 |
| 2018/0068872 A1* | 3/2018 | Lerner | H01L 21/76224 |
| 2018/0096842 A1* | 4/2018 | Varadarajan | C23C 16/401 |

* cited by examiner

CIRCUIT BASED ON A III/V SEMICONDUCTOR AND A METHOD OF OPERATING THE SAME

TECHNICAL FIELD

The present disclosure relates to an electronic circuit provided with a III/V semiconductor domain, and a method of operating such a circuit. In particular, the present application relates to electronic circuit based on a Gallium Nitride semiconductor.

BACKGROUND

Semiconductors components based on III/V semiconductors such as Gallium Nitride, GaN, diodes and GaN N-channel transistors, have a number of advantageous properties. For instance, GaN transistors have a relatively low on-resistance and can achieve higher switching speed compared to their silicon-based counterpart. As such, GaN components s are well suited for the design of switching converters and high-voltage power circuits.

However, the characteristics of GaN components, such as the forward voltage of a diode or the threshold voltage of a transistor, may vary significantly over a range of temperature and processes. For example, the characteristics of individual components obtained from different semiconductor wafers or from different dies may vary significantly. The characteristics of a GaN component, also referred to as GaN device, may vary by about 30% between two dies issued from a same wafer. This greatly complicates the implementation of accurate GaN voltage references.

As a result, GaN components must be controlled in a way that ensures proper operation over a wide variation of GaN parameters. In practice, this means that the gate voltage of a GaN transistor is over-driven to ensure operation in the saturation region of the transistor, typically in the region of 6V. Driving a GaN transistor with a high a gate voltage can cause severe degradation and over-stress to the GaN transistor. This also reduces operational efficiency and hinders linear mode operation of the device.

SUMMARY

It is an object of the disclosure to address one or more of the above-mentioned limitations. According to a first aspect of the disclosure, there is provided a circuit comprising a first domain coupled to a second domain, the first domain being based on a III/V semiconductor; wherein the first domain comprises a first component and a second component, the second component being representative of an electrical characteristic of the first component; and wherein the second domain comprises a sensor adapted to sense an electrical quantity of the second component; and an input generator coupled to the sensor, the input generator being adapted to provide at least one input to the first domain, wherein the at least one input is based on the electrical quantity.

Optionally, the second domain may be based on silicon.

Optionally, the second component may be a component of a same type as the first component. For example, the type of component may be a diode, a resistor or a transistor type. For instance, if the first component is a diode, then the second component may also be a diode.

Optionally, the second component may be a component having a smaller size than of the first component. For example, the first component may be a power transistor and the second component may be a signal transistor, such as a transistor making the power transistor.

Optionally, the input generator comprises at least one of a voltage source and a signal generator.

Optionally, wherein the first component comprises a diode and wherein the at least one input comprises a voltage input.

Optionally, the first component comprises a power switch, and the circuit comprises a transistor coupled in parallel to the power switch and a driver for driving the transistor, wherein the at least one input comprises a control signal for controlling the driver.

Optionally, the electrical quantity comprises at least one of a voltage and a resistance.

Optionally, the circuit is made from at least one die from a semiconductor wafer, and the first and second components are made from the same die.

Optionally, the sensor comprises a current source coupled to an analog to digital converter.

Optionally, the III/V semiconductor comprises Gallium Nitride.

Optionally, wherein the first domain comprises a plurality of first components, and a plurality of second components.

According to a second aspect of the disclosure, there is provided a method of operating a circuit comprising a III/V semiconductor domain having a first component, the method comprising providing a second component representative of an electrical characteristic of the first component; sensing an electrical quantity of the second component; generating at least one input based on the electrical quantity; and providing the at least one input to the III/V semiconductor domain.

Optionally, generating an input comprises generating at least one of a voltage and a control signal.

Optionally, the method comprises sensing a first voltage across the second component and generating a second voltage for the first component based on the first voltage. For example, the first voltage may be a voltage drop across a reference diode or a drain-source voltage of a reference transistor.

Optionally, the first component comprises a power-switch, and the method comprises providing a transistor coupled in parallel to the power switch; estimating a resistance of the power switch based on the electrical quantity; and switching the transistor on upon identifying that the resistance is above a threshold value.

BRIEF DESCRIPTION OF THE DRAWINGS

The disclosure is described in further detail below by way of example and with reference to the accompanying drawings, in which.

DESCRIPTION

Figure 1:
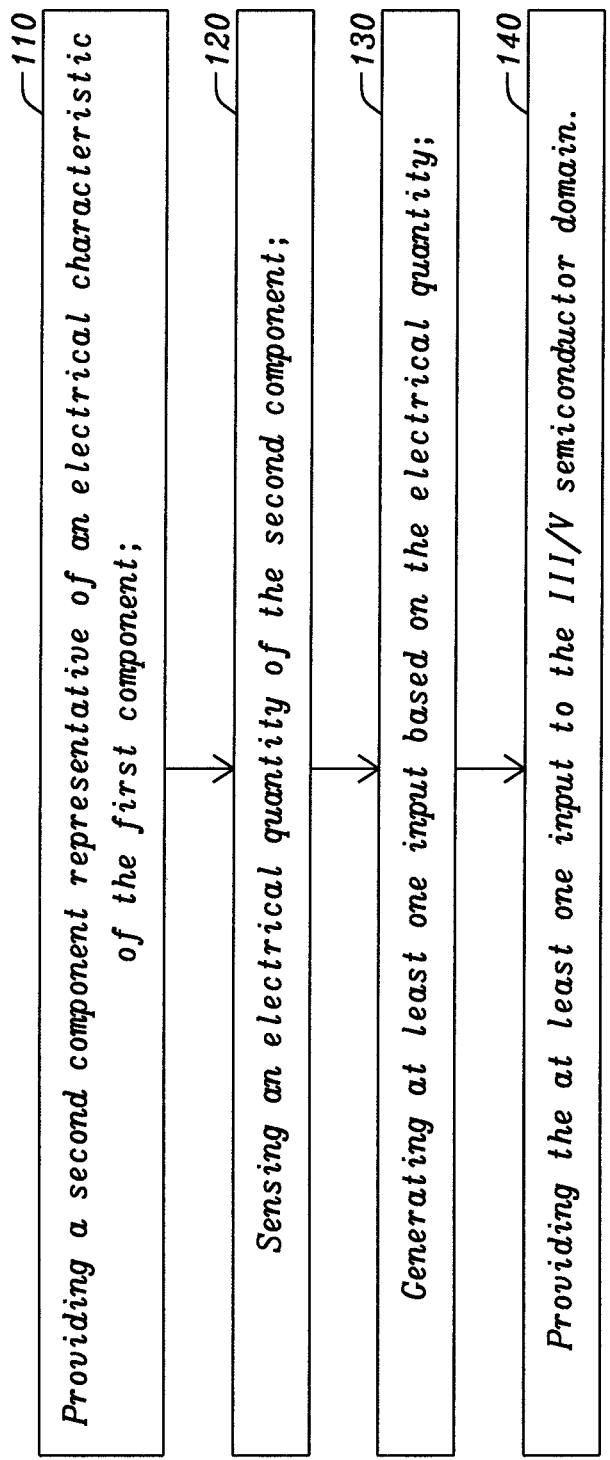
FIG. 1 is a flow diagram of a method for operating a circuit comprising a III/V semiconductor domain.

FIG. 1 illustrates a flow diagram of a method for operating a circuit comprising a III/V semiconductor domain. The III/V semiconductor domain includes a first component, such as a GaN component.

At step 110, a second component based on a III/V semiconductor, also referred to as reference component, is provided. The second component is representative of an electrical characteristic of the first component. For example, if the first component is a GaN diode, the second component may be another GaN diode used as a reference. Both first and second GaN diodes may be selected from a same semiconductor die, and be regarded as structurally identical.

At step 120, an electrical quantity of the second component is sensed. For example, the electrical quantity may be a voltage or a resistance across the second component. At step 130, at least one input is generated based on the electrical quantity. For example, an input voltage and a control signal such as a logic signal may be generated. At step 140, the at least one input is provided to the III/V semiconductor domain.

Figure 2:
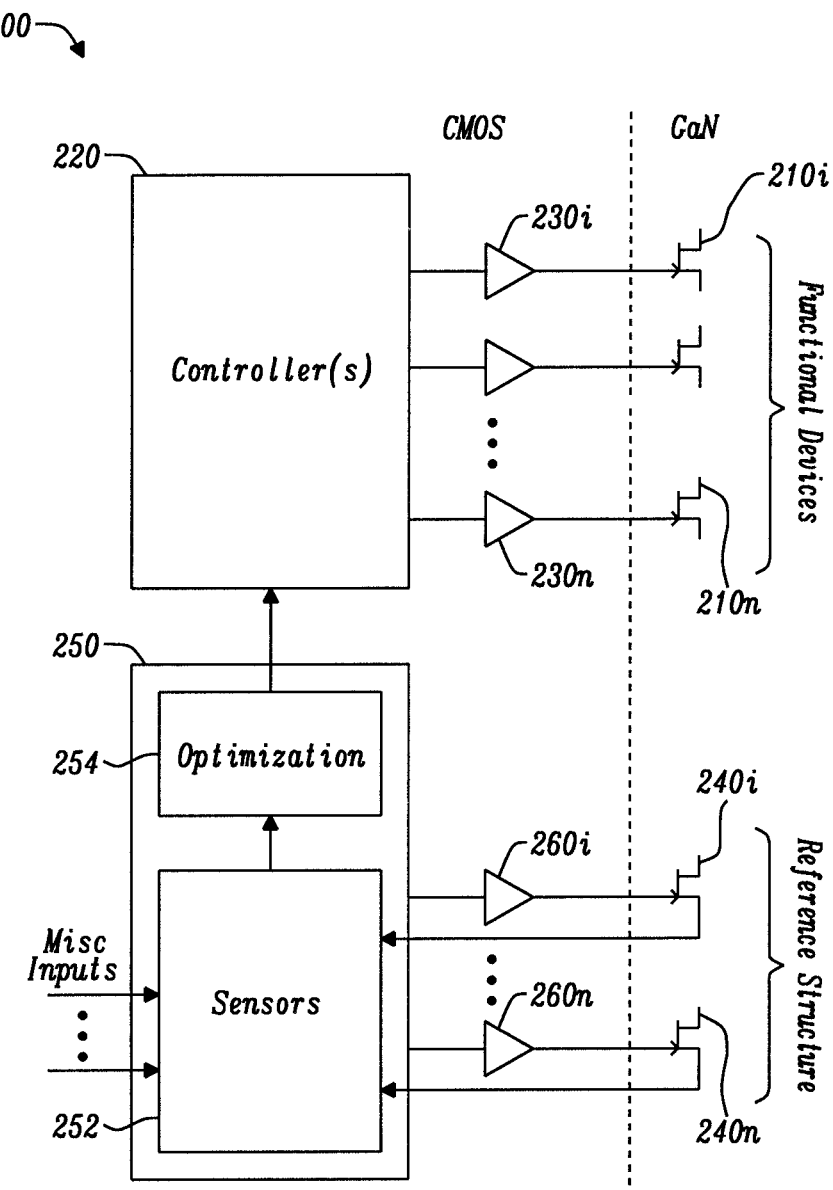
FIG. 2 is a schematic diagram of a system for implementing the method according to FIG. 1.

FIG. 2 shows a circuit 200 provided for implementing the method of FIG. 1. The circuit 200 includes two domains referred to as first and second domains. The first domain is based on a GaN semiconductor and includes a plurality (N) of GaN electronic components 210i . . . , 210n, also referred to as functional devices. The first domain also includes a plurality (N) of GaN reference components 240i, also referred to as reference structures.

Each reference components 240i is representative of an electrical characteristic of the a corresponding electric component 210i. For example, a reference component may be a transistor representing the electrical characteristic of another transistor located in the first GaN domain. Each GaN reference component 240i mimic a characteristic of a corresponding GaN electronic component 210i. For example, if the GaN reference component 240i and the electronic component 210i have been manufactured using a same process, then an operating characteristic, such as a current-voltage characteristic, of the GaN electronic component will be substantially the same as the operating characteristic of the GaN reference component.

The second domain is based on silicon semiconductor. The second domain includes a sensing unit 252 provided with one or more sensors coupled to the reference components; and a controller 220 coupled to the sensing unit 252. The controller 220 may be coupled to the sensing unit 252 via an adjuster 254 for adjusting an input signal to be received by the first domain. The adjuster 254 may be implemented in different ways depending on the application. The controller may also be part of the controller 220. The controller 220, the sensor 252 and the adjuster 254 may be part of a complementary metal-oxide-semiconductor, CMOS, integrated circuit.

The electronic components 210i are coupled to the controller 220 either directly (not shown) or via a variable driver 230i, for instance a variable voltage or current. Each GaN reference component 240i is coupled to the sensing unit 252. Each GaN reference component 240i may also be coupled to a variable driver 260i, for instance a variable voltage or current.

In operation, the sensing unit 252, senses an electrical quantity, such as a current, a voltage or a resistance value of a reference component 240i. The sensing unit 252 provides this value to the controller 220 either directly (not shown) or via the adjuster 254. The controller 220 can be used to control an input controlling the GaN electronic components based on the values measured by the sensing unit 252. For example, the controller may be used to control a voltage value provided by the drive voltage 230i. Alternatively controller 220 may generate an input signal to be used by the GaN domain. When the adjuster 254 is used, the adjuster 254 generates a feedback signal based on the measured electrical quantity.

By sensing an electrical quantity of the reference component, it is possible to monitor the operating characteristic of the GaN reference component 240i. As a result, the operating characteristic of the GaN electronic component 210i can be deduced. Hence, the controller 220 can operate the electronic component 210i closer to its operational characteristic curve. This reduces energy losses and improves the efficiency of the circuit.

In addition, the sensing unit 252 and/or the adjuster 254 may receive one or more additional inputs and generate the feedback signal based at least in part on this one or more additional inputs. For example, the adjuster 254 may receive a temperature value from a temperature sensor and generate a temperature adjusted feedback signal. In this way, the controller 220 may be capable of controlling the GaN electronic device at or close to its operating characteristic over a range of temperatures.

Figure 3:
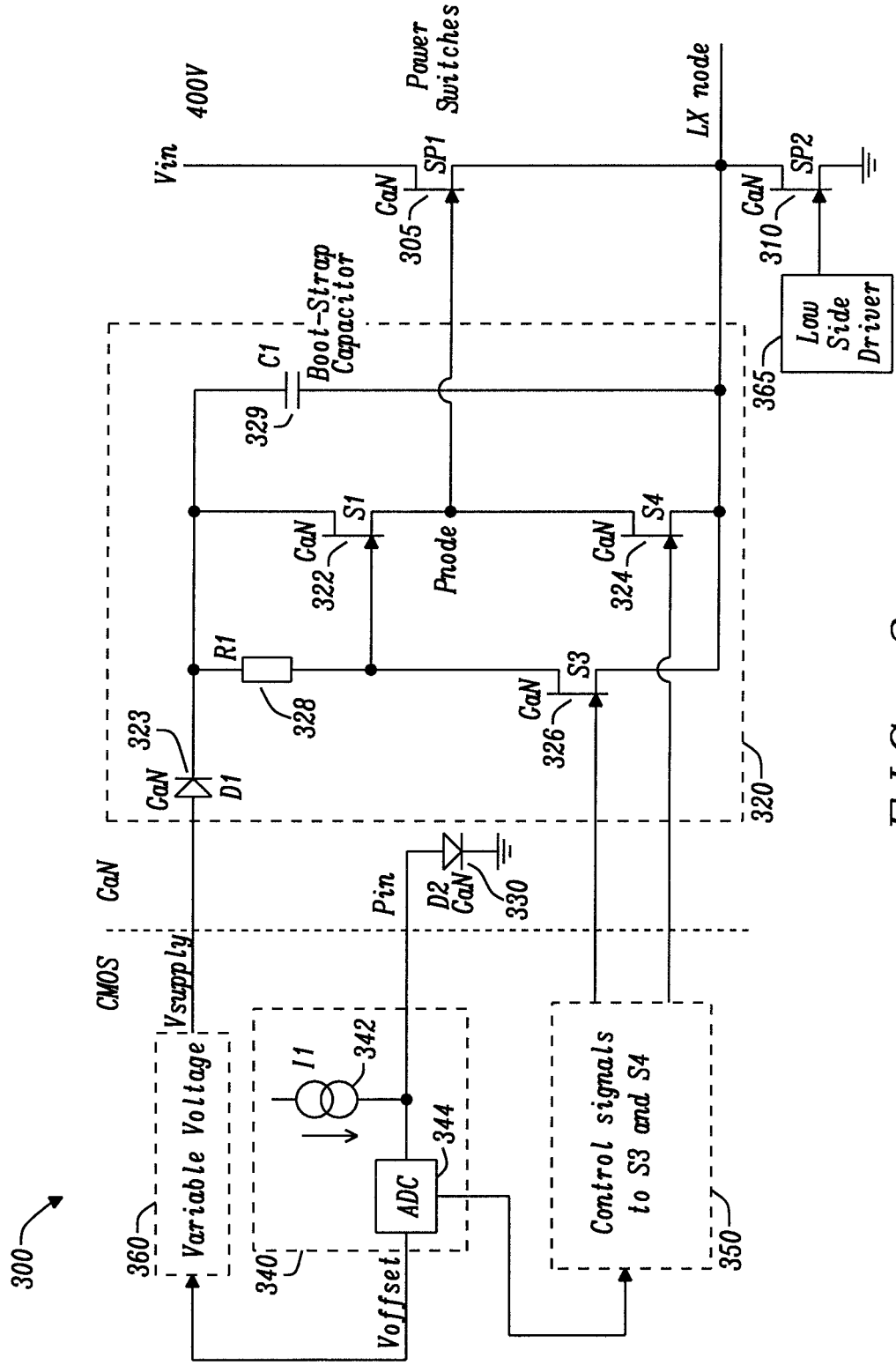
FIG. 3 is a diagram of a GaN power circuit provided with a GaN reference component.

FIG. 3, illustrates an exemplary implementation of a circuit of FIG. 2. In this example, the circuit is a power circuit 300 which may be part of switching converter, such as a buck converter. A first domain, referred to as GaN domain includes a half-bridge, a high-side driver 320 and a reference component 330 for example a diode reference D2. The half-bridge is formed of a high-side GaN power switch 305 coupled to a low-side GaN power switch 310 via a switching node. The high-side switch 305 has a drain for receiving an input voltage Vin, a source coupled to the LX node and a gate coupled to the node P. In a specific example, the input voltage Vin may be a high voltage, for example Vin may be in the region of 400V above a ground voltage.

The GaN domain also includes a low-side driver, 365. A second domain, referred to as silicon domain includes a sensor 340, a control signal generator 350 and a variable voltage source 360. The sensor 340 is coupled to the voltage supply 360. Depending on the application, the sensor 340 may also be coupled to the control signal generator 350. The variable voltage source 360 and the control signal generator may be combined in a single controller. The sensor 340 includes a current generator 342 for generating a current I1 coupled to an analog to digital converter ADC 344. The reference diode D2 330, has a first terminal coupled to the current generator and a second terminal coupled to the ground.

The high-side driver 320 includes a push-pull stage formed by a first transistor 322 coupled to a second transistor 324 via a push-pull node P. The push-pull stage is coupled to a third transistor 326. The first transistor 322 has a drain terminal coupled to the variable voltage source 360 via a diode D1 323; a source terminal coupled to the node P, and a gate terminal coupled to a drain terminal of the third transistor 326. The second transistor 324 has a drain terminal coupled to node P, a source terminal coupled to the switching node LX, and a gate terminal coupled to control signal generator 350. The third transistor 326, has a drain terminal coupled to the diode 323 via a resistor R1 328, a source coupled to the LX node, and a gate coupled to the control signal generator 350. A boot-strap capacitor 329 has a first terminal coupled to the diode D1 323 and a second terminal coupled to the node LX.

In operation, the controller 350 provides control signals, such as logic signals to the transistors S3 346 and S4 324, hence controlling the gate voltage of the high-side power switch SP1 305. In order to activate the high-side power switch SP1 305, an accurate gate voltage is required. Typically, SP1 requires a gate voltage of 6V to turn ON. High side and low side drivers are used to switch SP1 and SP2 simultaneously such that when SP1 is ON, SP2 is OFF. In this way SP1 and SP2 are never both ON at the same time, which would create a short circuit.

The boot-strap capacitor C1 329 is used to power the high side driver 320. In order to obtain the desired voltage across C1 one must be able to control voltage variations across different elements of the driver 320. In this case, the voltage across diode D1 323 may vary significantly due to for example temperature variations. The proposed solution is to estimate a voltage variation across the diode D1 323 by measuring a voltage across the reference diode D2 330 chosen substantially identical to D1. For example, the diode D1 and D2 may be fabricated from a same die. This voltage measurement is performed by the sensor 340 on the CMOS integrated circuit. In the example of FIG. 3, the reference diode D2 330 is directly connected to the ground and monolithically integrated to the rest of the GaN chip. Therefore, the voltage across D2 may be measured independently at any time.

Assuming that a voltage variation across the diode D2 330 varies in the same way as a voltage variation across the diode D1 323, it is possible to provide an appropriate voltage to the diode D1 323 in order to obtain the desired voltage across the Boot-Strap capacitor C1 329. The ADC 344 can be used to measure the voltage across the reference diode D2 330. The variable voltage source 360 is adapted to vary the voltage Vsupply based on the measured voltage across the reference diode. For instance, the measured voltage, referred to as Voffset can be added to a voltage V1 provided by the voltage source 360, such that Vsupply=V1+Voffset. Depending on the application, the voltage Vsupply may be adjusted by any factor of the measured voltage. For example, Vsupply may be equal to V1+N*(Voffset), in which N is an integer.

When the low-side power switch 310 is ON (closed) and the high-side power switch 305 is OFF (open) the capacitor C1 329 charges. When the low-side power switch 310 is OFF, the high-side driver 320, powered by C1 329, delivers an accurate gate voltage to turn the high-side power switch 305 ON. The transistors S1 322, and S4 324 form a push-pull stage for the high-side power switch 305. For example, assuming that the high-side power switch 305 requires a gate voltage of 6V, V1 may be set to 6V. The sensor 340 may measure a voltage Voffset across D2 330 of 1.5 V. This voltage corresponds to the voltage drop across D1 323. Assuming that the voltage threshold of the transistor S1 322 is also 1.5V, the voltage supply 360 can be adjusted to provide a voltage Vsupply=V1+2*(Voffset)=9V. Hence, when the switch S3 is turned off (open), the switch S1 turns on (closed) and the voltage at node P is 6V (defined by the gate voltage of S1 (7.5V) minus the threshold voltage of S1 (1.5V)). The voltage supply 360 can therefore be used to compensate for the voltage drop of D1 and the voltage threshold of the transistor S1. The charge stored in the capacitor C1 329 is limiting the available gate voltage for switching the high-side power switch 305.

Figure 4:
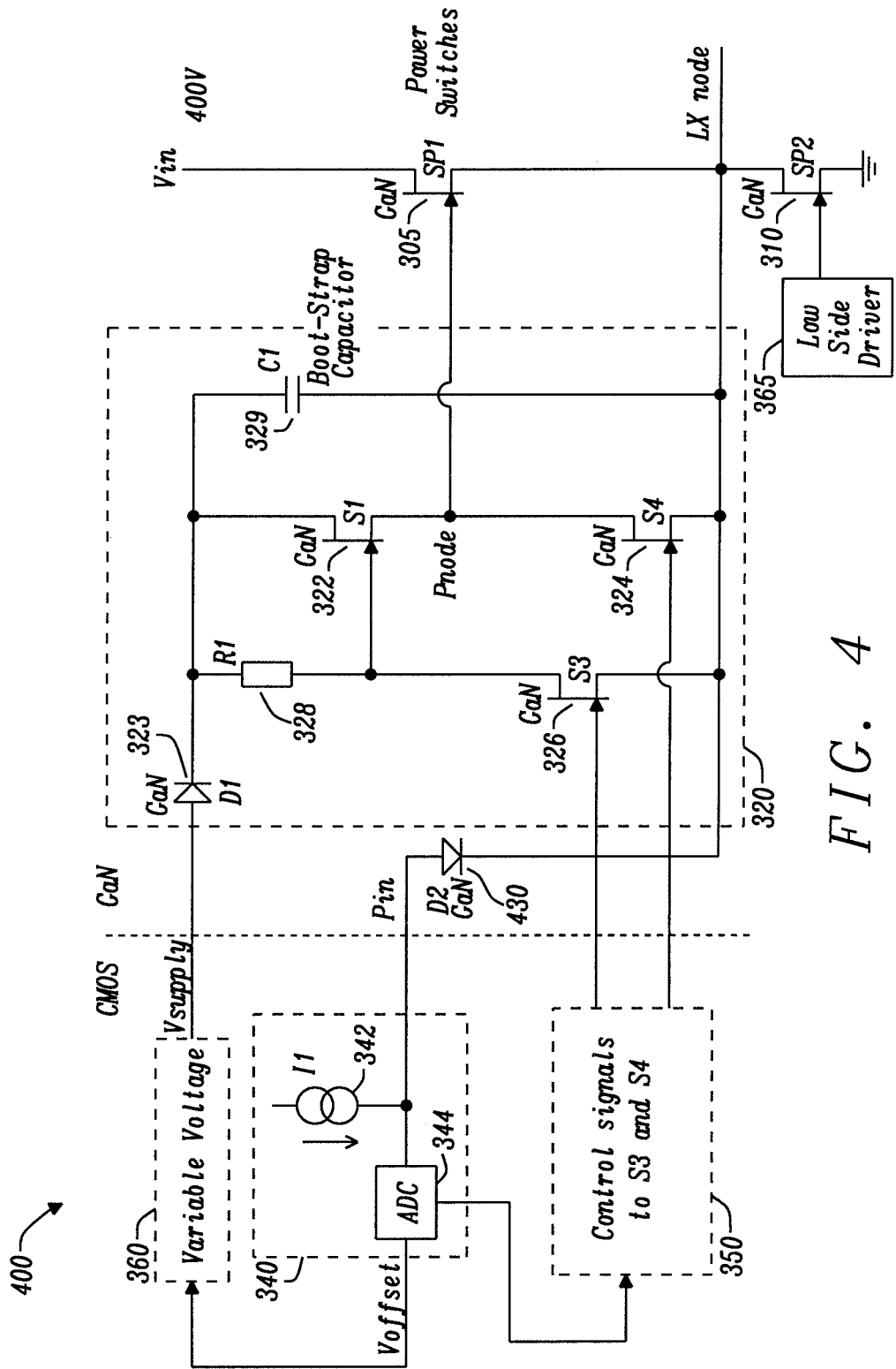
FIG. 4 is a modified circuit according to FIG. 3.

FIG. 4, illustrates a modification of the circuit of FIG. 3. In this case, the circuit 400 has a reference diode D2 430 that is coupled to the ground of the GaN chip via the low-side power switch 310. For this reason, the forward voltage across the reference diode D2 430 is measured when the low-side power switch 310 is turned on. Optionally, the voltage at the switching node LX may also be measured. If the switching node LX does not reach 0V, then the ADC measures a voltage equals to V(D2)+V(LX). This voltage can be used to adjust the voltage provided by the voltage supply and compensate for the voltage drop.

Figure 5:
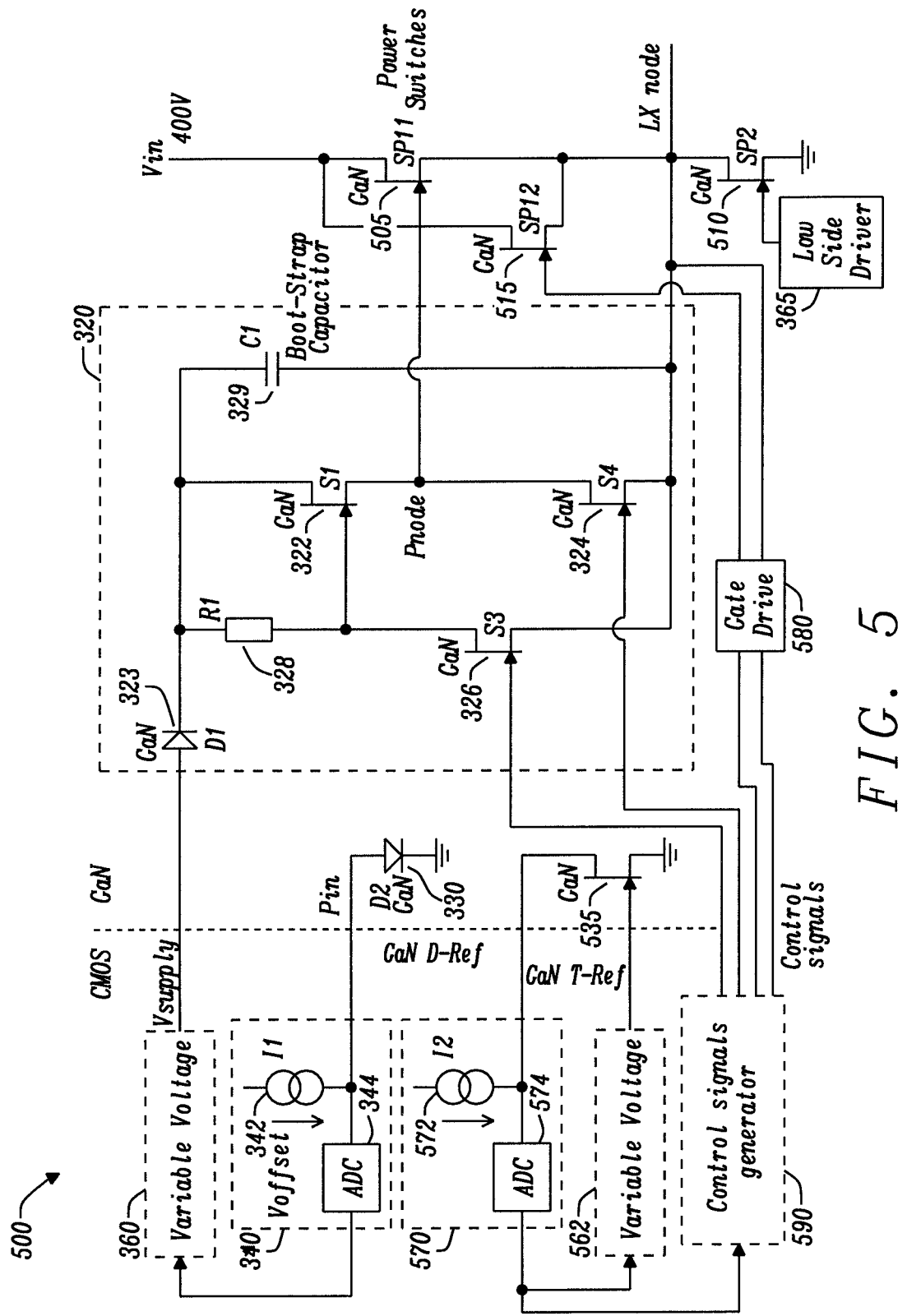
FIG. 5 is a diagram of a GaN power circuit provided with an over-current protection.

FIG. 5, illustrates another implementation of a circuit of FIG. 2, provided with a current protection circuit. In this example, one considers the problem of variations in transistor resistance-on ($R_{DS,on}$ or Ron) values. If the Ron of the high-side power switch varies too much then it is not possible to know when the high-side power switch needs to be switched off, for example when a current flowing through the power switch is too high. To address this problem, a GaN reference transistor (GaN T-Ref) is used as an indicator of Ron variation in the high-side power switch.

The circuit 500 of FIG. 5 shares many similar components to those illustrated in the circuit 300 of FIG. 3. The same reference numerals have been used to represent corresponding components and their description will not be repeated for sake of brevity.

A half-bridge is formed of a high-side GaN power switch 505 coupled to a low-side GaN power switch 510 via a switching node LX. A GaN transistor reference, GaN T-ref 535 is provided in the GaN domain, and a sensor 570 coupled to a voltage source 562 are provided in the Si-based domain. The sensor 570 includes a current generator 572 for generating a current I2 coupled to an analog to digital converter ADC 574. The reference transistor 535, has a drain terminal coupled to the current generator 572 a source terminal coupled to the ground, and a gate terminal coupled to the voltage source 562. The GaN T-ref 535 may be a smaller version of the high-side power switch 505. The circuit includes an additional transistor SP12 515 coupled in parallel to the high-side power switch 505 and controlled by its own gate driver 580. The sensor 570 is coupled to a control signal generator 590 for generating control signals directed to the gate driver 580, and the transistors S3 326 and S4 324

In operation, the Ron of the GaN reference transistor 535 can be measured on the CMOS integrated chip by measuring a voltage across the GaN T-ref. The ADC 574 is used to measure the drain-source voltage of the reference transistor 535. This measurement is used to estimate the Ron of the high-side power switch 505. If the Ron of high-side power switch 505 is too high, for example above a threshold value, then the transistor SP12 515, also referred to as add-on transistor, can be switched ON in order to lower the output resistance. For example, if the Ron of the high-side power switch 505 is 2 ohms and Ron of the add-on transistor 515 is 2 ohms, then the output resistance will be 1 ohm. Multiple add-on transistors can be added in parallel in order to adjust the output resistance.

Figure 6:
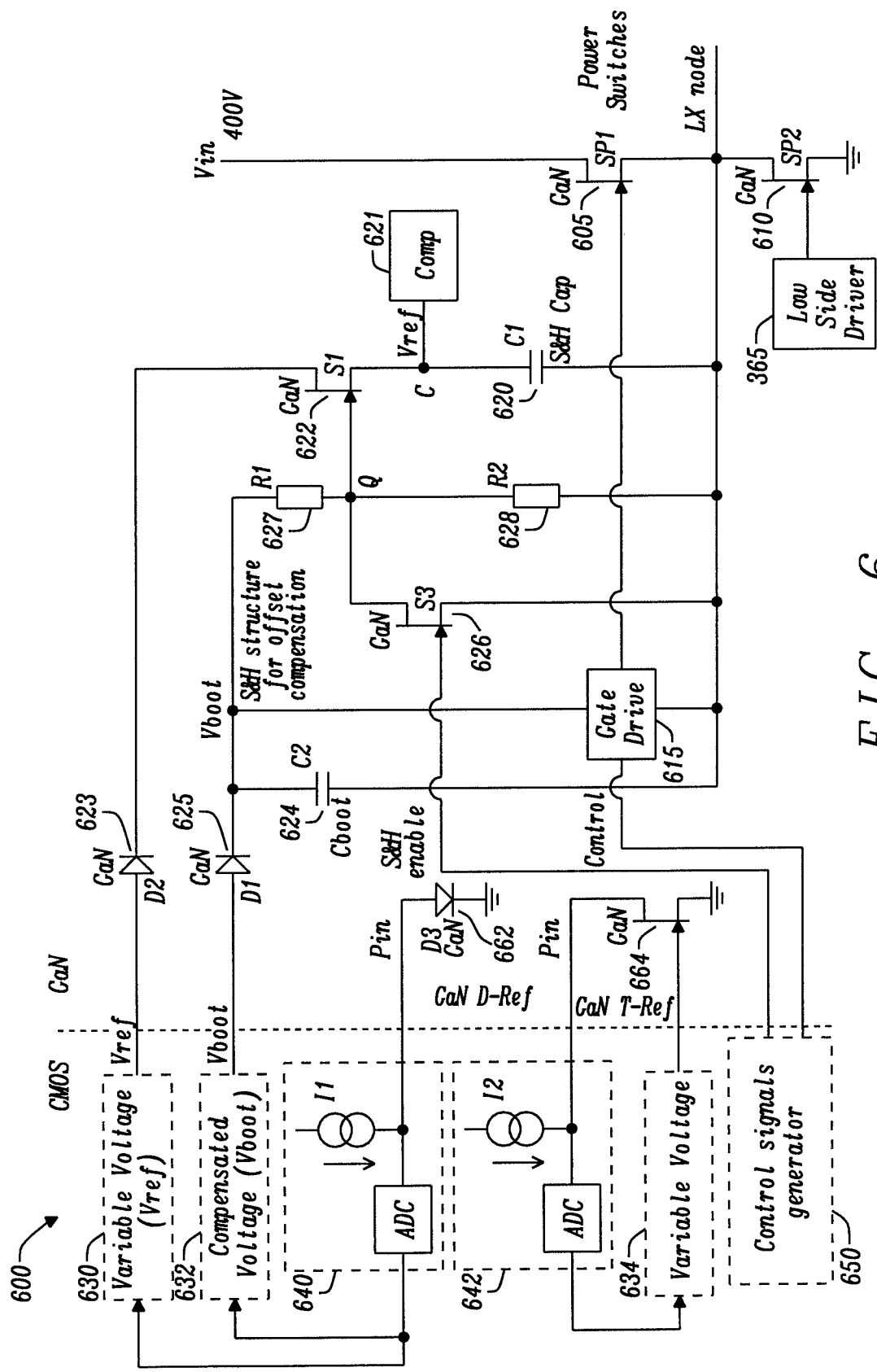
FIG. 6 is a diagram of a GaN power circuit provided with a sample and hold structure.

FIG. 6 illustrates yet another implementation of a circuit of FIG. 2, provided with a sample and hold structure. The circuit 600 includes a first domain referred to as GaN domain and a second domain referred to as silicon or CMOS domain. The GaN domain includes a high-side power switch 605 coupled to a low side power switch 610 via a switching node LX. The high-side power switch 605 has a gate coupled to a gate driver 615. The switching node LX is coupled to a sample and hold circuit formed by first capacitor C1 620 also referred to as sample and hold capacitor, coupled to a first transistor S1 622. The sample and hold circuit is coupled to a first variable voltage supply 630 via a first diode D2 623. The capacitor C1 has a first terminal coupled to S1 via a node C. Optionally, a comparator 621 may be coupled to the node C, for performing specific control functions. The switching node LX is also coupled to a second capacitor C2

624, also referred to as boot capacitor. The capacitor C2 624 is coupled to a second voltage supply 632 via a second diode D1 625.

The first transistor S1 622 has a gate coupled to a second transistor S3 626 via a node Q. The second transistor S3 626 has a gate coupled to a control signal generator 650, a drain coupled to the node Q, and a source coupled to the switching node LX. A resistance R1 627 has a first terminal coupled to the second diode D1 625 and a second terminal coupled to the switching node via a second resistance R2 628. The resistance R2 628 is optional. When the resistance R2 is used, R1 and R2 form a potential divider. For instance, R2 may have a resistance value about 10 times greater than R1, or greater.

The GaN domain is provided with a reference diode D3 662 and optionally with a reference transistor 664. The CMOS domain has a first sensor 640 for measuring a voltage across the reference diode 662 and a second sensor 642 for measuring a voltage across the reference transistor 664. The first and second sensors 640 and 642 may be implemented like the sensors 340 and 570 of FIG. 5. Depending on the application, the control signal generator 650 may be coupled to the sensors 640 and 642.

In operation, the reference diode D3 662 allows to accurately determine the voltage drops of GaN diodes 623 and 625, over process and temperature variations. Any such variation can be compensated for by the variable voltage supplies 630 and 632 providing the voltage reference Vref and the boot voltage Vboot respectively.

The first transistor S1 622 is used to control the voltage across the sample and hold capacitor C1 620. When the transistor S1 is ON (closed) the capacitor C1 charges. If Vref provided by the voltage supply 630 is less than the voltage Vboot provided by voltage supply 632 minus the voltage threshold of S1 622 Vth(S1), then C1 charges to Vref. If, however Vref is greater than Vboot-Vth(S1), then C1 charges to a voltage equals to Vboot-Vth(S1). When the transistor S1 is turned off, the capacitor C1 is isolated from the voltage supply 630 and holds the voltage.

The operation of transistor S1 may be controlled by the second transistor S3 626 which controls the voltage at node Q. When the transistor S3 is turned off (open), the voltage at node Q reaches VGSth to close S1 622. When the transistor S3 is turned on (closed) the voltage at node Q drops below VGSth and the transistor S1 is switched off.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A circuit comprising a first chip coupled to a second chip, the first chip being based on a III/V semiconductor and the second chip being based on silicon;
   wherein the first chip comprises a first diode having a first voltage drop, a second diode having a second voltage drop, wherein the first and second voltage drops are substantially the same, the first chip further comprising a power switch driver comprising the first diode and a boot-strap capacitor; and
   wherein the second chip comprises
   a first input generator coupled to the first diode;
   a second input generator coupled to the second diode;
   a sensor adapted to sense a voltage across the second diode; and an adjuster coupled to the sensor and to the first input generator, the adjuster being adapted to receive the voltage across the second diode; and to adjust, based on the received voltage, a voltage input provided by the first input generator to the first diode; wherein the voltage input is adjusted to compensate for the voltage drop across the first diode;
   wherein the first diode has an anode terminal connected to the first input generator and a cathode terminal connected to the boot-strap capacitor.

2. The circuit as claimed in claim 1, wherein the first input generator comprises at least one of a variable voltage source and a signal generator.

3. The circuit as claimed in claim 1, wherein the second diode has an anode terminal connected to the second input generator.

4. The circuit as claimed in claim 1, wherein the first chip further comprises a power switch, a transistor coupled in parallel to the power switch, a reference transistor and a driver for driving the transistor.

5. The circuit as claimed in claim 1, wherein the circuit is made from at least one die from a semiconductor wafer, and wherein the first and second diodes are made from the same die.

6. The circuit as claimed in claim 1, wherein the sensor comprises a current source coupled to an analog to digital converter.

7. The circuit as claimed in claim 1, wherein the III/V semiconductor comprises Gallium Nitride.

8. The circuit as claimed in claim 1, wherein the first chip comprises a plurality of first diodes, and a plurality of second diodes.

9. A method of operating a circuit comprising a first chip coupled to a second chip, the first chip being based on a III/V semiconductor, and the second chip being based on silicon, the method comprising the steps of:
   providing the first chip with a first diode having a first voltage drop, a second diode having a second voltage drop, wherein the first and second voltage drops are substantially the same, the first chip further comprising a power switch driver comprising the first diode and a boot-strap capacitor;
   providing the second chip with a first input generator coupled to the first diode; a second input generator coupled to the second diode; a sensor adapted to sense a voltage across the second diode; and an adjuster coupled to the sensor and to the first input generator;
   sensing the voltage across the second diode; and
   adjusting a voltage input provided by the first input generator to the first diode based on the sensed voltage across the second diode; wherein the voltage input is adjusted to compensate for the voltage drop across the first diode;
   wherein the first diode has an anode terminal connected to the first input generator and a cathode terminal connected to the boot-strap capacitor.

10. The method as claimed in claim 9, comprising generating at least one of a voltage and a control signal to provide the voltage input.

11. The method as claimed in claim 9, the method further comprising generating a second voltage for the first diode based on the sensed voltage across the second diode.

12. The method as claimed in claim 9, the method further comprising the steps of:
   providing a transistor coupled in parallel to a power switch;
   providing a reference transistor;

estimating a resistance of the power switch using the reference transistor; and switching the transistor on upon identifying that the resistance is above a threshold value.

* * * * *